United States Patent
Wang et al.

(10) Patent No.: US 9,659,600 B2
(45) Date of Patent: May 23, 2017

(54) FILTER CUSTOMIZATION FOR SEARCH FACILITATION

(71) Applicants: Heng Wang, Shanghai (CN); Gufei Sun, Shanghai (CN); Wen-Syan Li, Fremont, CA (US)

(72) Inventors: Heng Wang, Shanghai (CN); Gufei Sun, Shanghai (CN); Wen-Syan Li, Fremont, CA (US)

(73) Assignee: SAP SE, Walldorf (DE)

( * ) Notice: Subject to any disclaimer, the term of this patent is extended or adjusted under 35 U.S.C. 154(b) by 226 days.

(21) Appl. No.: 14/328,522

(22) Filed: Jul. 10, 2014

(65) Prior Publication Data
US 2016/0012135 A1    Jan. 14, 2016

(51) Int. Cl.
| G06F 17/30 | (2006.01) |
| G11C 5/04 | (2006.01) |
| G06F 13/42 | (2006.01) |
| G11C 5/06 | (2006.01) |
| G11C 14/00 | (2006.01) |

(52) U.S. Cl.
CPC ............ *G11C 5/04* (2013.01); *G06F 13/4282* (2013.01); *G06F 17/30867* (2013.01); *G11C 5/06* (2013.01); *G11C 14/0018* (2013.01); *G06F 2213/0032* (2013.01)

(58) Field of Classification Search
USPC ................ 707/609, 387, 705, 790, 813, 821
See application file for complete search history.

(56) References Cited

U.S. PATENT DOCUMENTS 7,831,548 B1 * 11/2010 Round .............. G06F 17/30893
                                                707/609

* cited by examiner

*Primary Examiner* — Sana Al Hashemi
(74) *Attorney, Agent, or Firm* — Brake Hughes Bellermann LLP

(57) ABSTRACT

A classifier may be used to receive, via a website, user input associated with a product search of a user, and may be further used to identify a plurality of filters associated with the product search and predict a user-specific subset of the plurality of filters. Then, a filter manager may be used to provide a webpage of the website to the user, based on the user-specific filter subset.

18 Claims, 10 Drawing Sheets

| Data | |
|---|---|
| Age, Gender, Location, Income, Browsing History, Shopping History, Search History,... | |
| Category | |
| Laptop | |
| Label | |
| Filter | Interested? |
| Color | 0 |
| Processor Brand | 1 |
| Processor Speed | 1 |
| Weight | 1 |
| Screen Size | 1 |
| Build-in Webcam | 0 |
| Optical Drive | 1 |
| ...... | ...... |

FIG. 6

FILTER CUSTOMIZATION FOR SEARCH FACILITATION

TECHNICAL FIELD

This description relates to the use of filters for searching for desired information.

BACKGROUND

Providers of online information have an ability to provide vast quantities of such information, but may find it difficult to match intended users with specific, desired portions of the available information. For example, providers of online shopping websites may offer many products for sale, yet potential customers may be unable to identify a specific product for purchase.

Consequently, providers attempt to assist potential customers and other users in finding particular products or other information. For example, search engines may be used to receive search queries from potential customers, and to provide search results that are determined to be potential matches for the received query. Somewhat similarly, in the context of online shopping websites, filters may be provided to customers to assist the customers in browsing products for sale.

For example, providers of online shopping websites may have a vast inventory of products for sale, and it may be difficult for a potential customer to locate a specific, desired product. Consequently, the website provider may utilize a plurality of filters that are designed to select one or more subsets of the products for sale, so as to restrict a number of available choices experienced by the potential customer, and, ideally, allow the potential customer to select from among such filters to obtain products that are of particular interest to the potential customer.

In practice, however, such filters may be too few, too numerous, too general, or too specific to meet the needs of a given potential customer. Moreover, different potential customers may have different needs and preferences with regard to what type of product to buy. As a result, customers may experience frustration and inconvenience, and may be unable to locate a desired product for purchase. Meanwhile, providers may experience decreases in profits and reduced customer satisfaction levels.

SUMMARY

According to one general aspect, a system may include at least one processor, and instructions recorded on a non-transitory computer-readable medium, and executable by the at least one processor. The system may include a classifier configured to cause the at least one processor to receive, via a website, user input associated with a product search of a user, the classifier being further configured to identify a plurality of filters associated with the product search and predict a user-specific subset of the plurality of filters. The system may further include a filter manager configured to cause the at least one processor to provide a webpage of the website to the user, based on the user-specific filter subset.

According to another general aspect, a computer-implemented method for executing instructions stored on a non-transitory computer readable storage medium may include determining a user profile of a user browsing a category of products provided by a website, and predicting, based on a user profile classification of the user profile, at least one filter for the category. The method may further include receiving a query from the user via the website, predicting, based on a query classification of the query, at least one filter and associated filter value for the query, and providing a webpage of the website to the user in which the at least one filter for the category is provided in a first portion as a selectable option for the user, and the at least one filter for the query and at least one associated filter value are applied against the products of the category to thereby provide value-specific filtered products within a second portion of the webpage.

According to another general aspect, a computer program product may be tangibly embodied on a non-transitory computer-readable storage medium and may include instructions that, when executed, are configured to cause at least one processor to receive, via a website, user input associated with a product search of a user, the user input including a category of products and a query, and predict a first filter associated with the category, based on a user profile of the user and on a user profile classification model. The instructions, when executed, may be further configured to cause the at least one processor to predict a second filter associated with the query, based on the query and on a filter classification model, predict at least one value for the second filter, and provide a webpage of the website to the user. The webpage may include the first filter associated with the category as a user-selectable option for filtering products displayed on the webpage, and value-specific filtered products obtained by applying the second filter associated with the query against available products, using the at least one value.

The details of one or more implementations are set forth in the accompanying drawings and the description below. Other features will be apparent from the description and drawings, and from the claims.

BRIEF DESCRIPTION OF THE DRAWINGS

FIG. 6 is a table including example training data for use in the system of FIG. 5.

DETAILED DESCRIPTION

Figure 1:
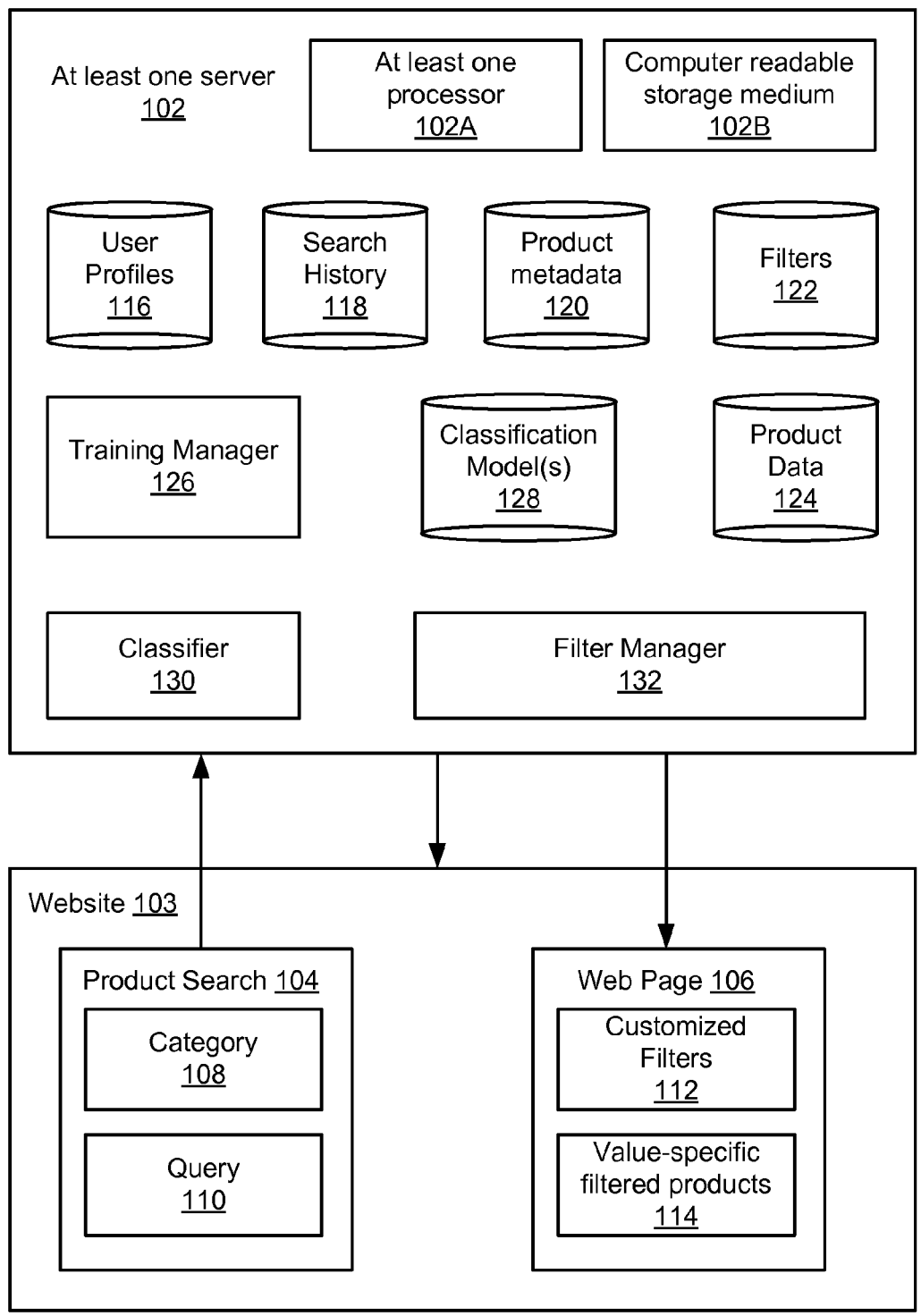
FIG. 1 is a block diagram of a system for filter customization for search facilitation.

FIG. 1 is a block diagram of a system 100 for filter customization for search facilitation. In the example of FIG.

1, at least one server 102 is illustrated as providing a website 103. As shown and described, the at least one server 102 may receive a product search 104, and may provide a webpage 106 in return. For example, the product search 104 may include a first product search based on a category 108 received from the user, and/or a specific query 110 received from the user. Then, as shown, the at least one server 102 may proceed to dynamically generate the webpage 106, including customized filters 112, in conjunction with value-specific filtered products 114. In this way, as described in detail below, the at least one server 102 may provide the webpage 106 in a manner that is personalize for, and very convenient to, a user thereof, and that allows the user to identify and potentially select products for purchase, in a manner that is fast and efficient.

For example, the provider of the at least one server 102 may represent a provider of the website 103 as an online shopping website, which may offer a large number of products and types of products for sale. Consequently, as referenced above, the product search 104 received from the user may include a category 108, which represents a general type, class, or characteristic of products for sale. Of course, the term product should be understood generally to represent any item for which a user might search, including physical items for delivery, software items for download or other access, or simply informational items (e.g., documents or other data) that a user might desire. Thus, in various scenarios, such items may be commercially available for a specified price, or, in other scenarios, may represent free or publically-available items.

For example, if the provider of the at least one server 102 sells laptops, clothes, shoes, and sporting goods, among other products, then the product search 104 may provide the user with an ability to submit the category 108, which may then be used by the at least one server 102 to provide the customized filters 112 in a manner that is customized with respect to the user in question. For example, if the user submits the category 108 as a "laptop computer" category, then the customized filters 112 within the webpage 106 may be customized with respect to the individual user, in the context of that category.

For example, the customized filters 112 may give the user an option of selecting a specific filter to thereby obtain a listing of products for sale within the specified category, and in a manner that is highly specific to the individual user. For example, a first user may be highly sensitive to price, so that the customized filters 112 may include a price filter, while a second user may be more sensitive to a size and weight of products within the identified category 108, so that the customized filters 112 experienced by the second user will be different from those provided to the first user.

Somewhat similarly, the query 110 may include specific search terms, which the at least one server 102 may utilize to provide value-specific filtered products 114 within the webpage 106. That is, for example, if the user is interested in the category of laptop computers, and the query 110 indicates a concern with cost, then the webpage 106 may be generated as including the provided filters 112 that are customized to the user with respect to the category 108, as described above, as well as a listing of laptop computers that are within a certain price range, or otherwise matching characteristics of the query 110. More specifically, as described, the listing may be generated by predicting additional or alternative filters, based on the query 110, and further predicting specific filter values or filter value ranges that are then applied to the predicted filters to obtain the value-specific filtered products 114.

Consequently, the webpage 106 may be provided as including a relatively small number of particularly relevant filters, and associated value-specific filtered products 114. In other words, the at least one server 102 provides customized, relevant filters, and, further, for at least some filters, goes farther to actually select a specific value or range of values from corresponding filters. In this way, the user is provided with suggested products and associated characteristics that are thought to be highly likely to be of interest to the user. Of course, the user may additionally be provided with an ability to refine existing aspects of the product search 104, e.g., by parameterizing or otherwise selecting from among the customized filters 112.

Thus, by providing the customized filters 112 and the value-specific filtered products 114 within the webpage 106, the server 102 avoids the possibility of overwhelming the user with a needless quantity of filters and/or products. Moreover, the user may be provided with filters that are most likely to be useful to, and, valued by, the user, and, in particular, filters which are determined to be of a highest value to the user may be placed more prominently, for an easier access by the user.

Moreover, a number of the customized filters 112 that is provided may be customized based on a current, particular circumstance or preference of the user. For example, a greater or lesser number of filters may be provided, depending on a screen size of a device currently being used by the user. Consequently, the user may avoid excessive scrolling for navigation when reviewing the customized filters 112 and the value-specific filtered products 114.

Thus, the server 102 provides the webpage 106 in a manner which accounts for both the personal user profile of the user, including relatively stable or historic characteristics of the user, such as a user's age, income level, or search history, while also considering the individual query 110 representing a current search of the user for a specific product. In this way, the webpage 106 is likely to assist the user in quickly identifying a desired product, thereby enhancing a convenience of the user, and increasing a profitability and reputation of the provider of the server 102 and the webpage 106.

In more detail, the system 100 utilizes various types of available data to predict current or future needs of the user. For example, as shown in FIG. 1, one or more user profiles 116 represent individual user profiles which correspond to individual users of the system 100. As described in more detail below, such user profiles may include personal characteristics of the corresponding individual user, such as an age, income level, location, or other characteristic. Each user profile also may include information regarding previous interaction of the user with the website 103, such as a previous search history or previous purchases made by the user.

Also in FIG. 1, a search history 118 may represent a more general search history collected across a number of users, perhaps categorized by aspects of the various searches, and/or by the products ultimately selected as a result of corresponding searches. In other words, in the example of FIG. 1, the search history 118 represents general search histories of multiple users that may be used to classify and predict information with respect to a current, individual user.

Of course, FIG. 1 is merely intended as an illustrative, non-limiting example, and data included therein may be organized in many different ways. Specifically, although the user profiles 116 and the search history 118 are illustrated separately in FIG. 1, it may be appreciated that portions of the search history 118 may also be categorized or stored with respect to individual users of the context of the user profiles 116. In this regard, more specific examples of techniques for constructing, storing, and accessing the user profiles 116 and the search history 118 are provided in more detail below, and, moreover, additional or alternative variations would be apparent to one of skill in the art.

Also in FIG. 1, product metadata 120 refers generally to information categorizing products or types of products according to specific characteristics thereof. For example, such product metadata may include characterizations of general aspects of products for sale, such as, for example, color, price, weight, and other aspects that may be common to many or all of the products for sale. In other examples, the products metadata 120 may be specifically derived with respect to price of products for sale. For example, laptop computers may be categorized according to processor speed, available graphics, size of memory, or other aspects that would be applicable in the specific category of laptop computers.

Filters 122 represent all available filters that have been constructed by a designer or administrator of the system 100, using the product metadata 120. For example, continuing the example of laptop computers, available filters may include filters for the characteristics just referenced, as well as virtually any other characteristic of laptop computers that may be relevant to the user in deciding whether to purchase a particular laptop computer.

As referenced above, it is possible to construct a large number of such filters, even within a limited category such as laptop computers. It is possible to track a frequency of use of particular filters of the filters 122 across a large number of users, e.g., based on the search history 118. Then, it is possible to select and arrange particular filters based thereon. However, while the system 100 of FIG. 1 may be operable to use such techniques in some circumstances, such techniques, by themselves, do not provide the type of customization and personalization referenced above with respect to the webpage 106. For example, the characteristic valued most highly across all users may be price, while a particular user may value speed or size more highly than price.

A final example of available data in FIG. 1 is product data 124, which refers to data about individual products for sale. For example, the product data 124 may include inventory information characterizing a specific item availability or location for shipping purposes.

Of course, the various types of data 116-124 are not intended to represent all types of data that may be used for predicting an individual user's preferences and desires with respect to the types of filter customization techniques described herein. Rather, the types of data 116-124 are intended merely as an illustrative basis for describing example techniques for accurately predicting preferences of the user with respect to filter customization. Consequently, as referenced above, available data may be selected, formatted, or stored in any suitable manner.

In order to utilize such available data to provide the webpage 106 as described herein, a training manager 126 may be configured to analyze designated portions of the data, to construct training sets for use with respect to classification models 128. For example, as described in detail below, various machine learning techniques, or other types of artificial intelligence techniques, may be used to analyze available data, and to construct the classification model(s) 128. Then, a classifier 130 may be configured to make predictions regarding current or future preferences of a given user in a given circumstance, to thereby provide the customized filter characteristics of the webpage 106.

As referenced above, and described in more detail below, the classifier 130 is thus capable of providing the customized filters 112, based on a specific user profile of the individual, current user of the system 100. For example, continuing the laptop computer example from above, the classifier 130 may determine that a particular user is highly interested in a price of laptop computers for sale, as well as a color of available models. Therefore, by including a color filter within the customized filters 112, the user may easily select from among the various preferred colors of the user.

At the same time, the classifier 130 may utilize the individual query 110 to predict the value-specific filtered products 114 of the webpage 106. For example, if the query 110 indicates that the user is interested in identifying a laptop computer having a low weight, then the classifier 130 may effectively select a weight filter from the filters 122, and proactively parameterize the selected weight filter based on the query 110, so that the value specific filter products 114 conform to the inferred preference of the user.

Of course, many variations are possible. For example, as referenced above and described in detail below with respect to FIG. 3, the classifier 130 may utilize the selected category 108 (e.g., laptop computers) together with a specific user profile of the individual user to predict the customized filters 112. Meanwhile, the query 110 may be used to predict additional filters and associated values or value ranges thereof, to thereby provide the value-specific filtered products 114 (e.g., specific laptop computers conforming to corresponding, predicted values for price, color, weight, or other characteristics).

In additional or alternative implementations, the classifier 130 may also utilize both the category 108 and the query 110, in conjunction with the user profile, to provide the customized filters 112. Additionally, the classifier 130 may utilize the user profile in selecting the value specific filter products 114. Accordingly, and in general, many types of classification techniques may be used by the training manager 126 and the classifier 130 as referenced above, and described in more detail below. In these and other implementations, the webpage 106 is provided with filter customization that allows the user to quickly and accurately identify desired products for potential purchase thereof, in a manner that is convenient and efficient for the user. Consequently, the user is enabled to locate such desired products, with a minimum of scrolling or navigation, even when viewing the webpage 106 on a relatively small screen, including a screen of a tablet or smartphone.

In operation, once the classifier 130 has identified predicted filters and filter parameters, based on the classification model 128, a filter manager 132 may be configured to retrieve the identified filters from the filters 122, and to instantiate or execute any subsets thereof, in accordance with any parameter values provided by the classifier 130. For example, the filter manager 132 may apply a selected filter against the product data 124, so as to display the filter in question within the customized filters 112 in conjunction with a display of a quantity of products within the product data 124 which complies with the filter characteristic. For example, in this way, a color filter may indicate a number of products within a selected category having a given color and currently available for sale.

Further, the filter manager 132 may be configured to display content of the webpage 106 in a desired or optimized manner. For example, in scenarios in which an available screen size is small, the filter manager 132 may be configured to select an appropriate number of the customized filters 112. Further, the filter manager 132 may be configured to lay out or arrange content of the webpage 106 in a desired or preferred manner, to receive selections of one or more filters or products from the user, and to otherwise manage the user experience with respect to the provided, customized filters and filter values.

In the example of FIG. 1, the server 102 is illustrated as at least one server, and should be understood to represent or include, e.g., two or more servers, as may be appropriate. For example, the system 100 may be implemented using an application server responsible for providing transaction processing and other services related to the operation of the online shopping website 103, as well as a web server configured to interact with the user, and to provide general network support for providing the website 103 over an intervening network, e.g., the public Internet.

Accordingly, it may be appreciated that the various components 116-132 illustrated as being included within the at least one server 102 may be stored and/or implemented in an appropriate server or other platform. More generally, any of the illustrated components 116-132 should be understood to be illustrative examples, so that data or functionality associated with any single component may be understood to be stored or implemented using two or more subcomponents. Conversely, two or more of the components 116-132 may be combined for execution as a single component, depending on an available platform being used, and/or a design preference of an administrator or other provider of the at least one server 102.

Thus, the at least one server 102 should be understood to include any conventional or appropriate hardware or software that may be required or advantageous for a given implementation of the system 100 of FIG. 1. By way of example, the at least one server 102 is illustrated as including at least one processor 102A, as well as non-transitory computer readable storage medium 102B. For example, the at least one processor 102A may represent two or more processors executing in parallel to thereby execute instructions stored using the non-transitory computer readable storage medium 102B, to thereby provide the above described functionalities of the at least one server 102. Of course, one or more appropriate memories may similarly be used to store the various data described above in conjunction with the various data repositories 116-124.

Many other conventional hardware/software components may be included within any given implementation of the at least one server 102, such as network interface hardware/software, input/output peripherals, and various other computing components. Similarly, although also not specifically illustrated in the example of FIG. 1, and as referenced above, the website 103 should be understood to be provided in the context of an appropriate client device of the user, by way of a browser application chosen by the user. Aspect of such implementation details would be apparent to one of skill in the art, and are consequently not described herein in further detail, except as may be necessary or helpful in understanding operations of the system 100 of FIG. 1.

Figure 2:
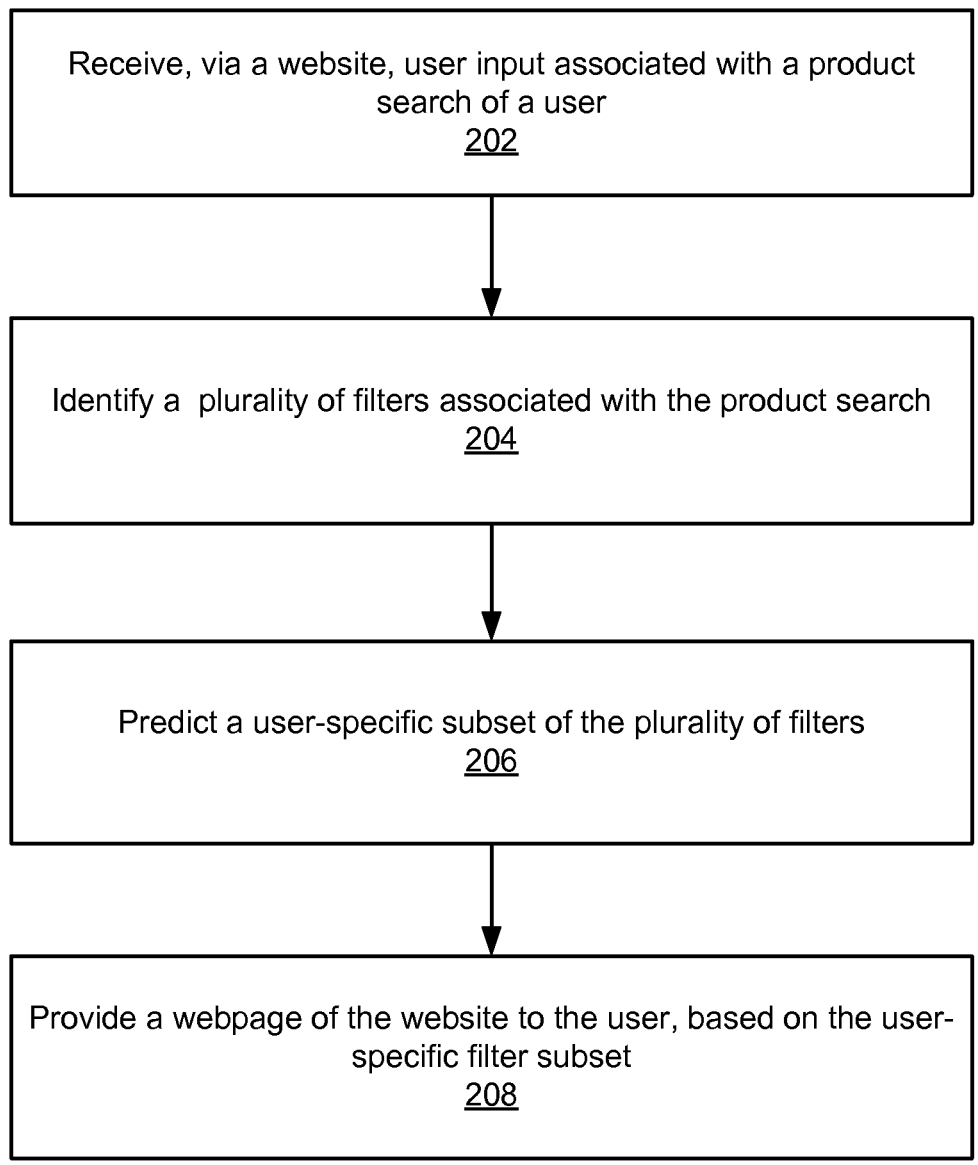
FIG. 2 is a flowchart illustrating example operations of a system for FIG. 1.

FIG. 2 is a flowchart illustrating example operations of the system 100 of FIG. 1. In the example of FIG. 2, operations 202-208 are illustrated as separate, sequential operations. However, in some implementations, various additional or alternative operations or sub-operations may be included, while, in other implementations, one or more operations or sub-operations may be omitted. In all such implementations, it may be appreciated that any two or more operations or sub-operations may executed in a partially or completely overlapping or parallel manner, or in a nested, iterative, looped, or branched manner.

In the example of FIG. 2, user input associated with the product search of a user may be received via a website (202). For example, the server 102, e.g., the classifier 130 may receive one or both of the specified category 108 and the individual query 110, as part of the product search 104 of a user of the system 100.

A plurality of filters associated with the product search may be identified (204). For example, the classifier 130 may identify the filters 122. In more specific examples, the classifier 130 may receive the category 108, and may select all category-related filters from the filters 122.

A user specific subset of the plurality of filters may be predicted (206). For example, the classifier 130 may utilize one or more of the classification models 128, as provided by way of the training manager 126, to predict which of the identified filters will be of particular importance or relevance to the user from whom the product search 104 was received.

For example, the predicted user's specific subset of filters may be considered to be user-specific in the sense that the subset is provided as part of an online process, in response to a current receipt of the product search 104 from the user. Additionally, or alternatively, the predicted subset of filters may be user-specific in the sense of being selected based at least in part on the corresponding user profile of the user in question. Further, the predicted subset of filters may be user-specific in the sense that the predicted subset is provided in response to the individual query 110 received from the user.

A webpage of the website may be provided to the user, based on the user-specific filter subset (208). For example, the filter manager 132 may be configured to provide the webpage 106 of the website 103, including some or all of the customized filters 112 and/or the value specific filtered products 114. That is, for example and as described above, the customized filters 112 may include filters that are provided for the user to select or ignore, at the user's discretion. Meanwhile, the value-specific filtered products 114 should be understood to represent the identification and use of a predicted subset of filters that have been parameterized with predicted filter values, and thereafter directly applied by the filter manager 132 against the product data 124.

Figure 3:
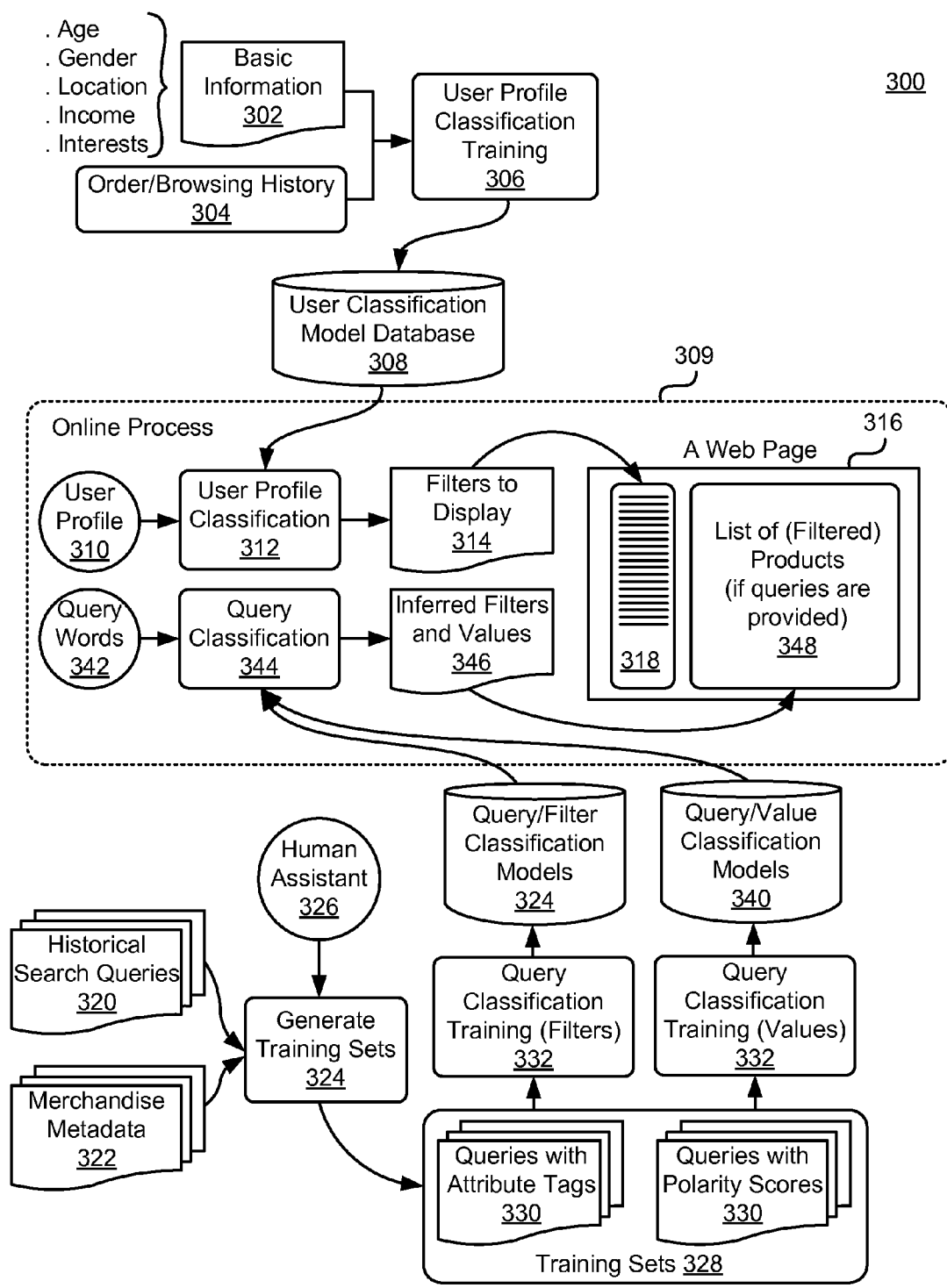
FIG. 3 is a block diagram of a system illustrating more detailed example implementations of the system of FIG. 1.

FIG. 3 is a block diagram of a system 300 illustrating a detailed example implementation of the system 100 of FIG. 1. In the example of FIG. 3, basic information 302 of a user profile for an individual user is illustrated as potentially including an age, gender, location, income, or interest of the user. Meanwhile, an order/browsing history 304 represents historical information describing previous transactions and potential transactions stored with respect to the user in question.

Then, a user profile classification training module 306, as an example instance of the training manager 126 of FIG. 1, may be used to leverage training data to construct a user classification model database 308. Specific techniques for using a training set of data to construct the user classification model database 308 are described below with respect to FIGS. 6 and 7. In general though, as referenced above, it may be understood that the components 302-308 of the system 300 effectively represents an offline or design time process for constructing and storing the user classification model database 308, for the purpose of using associated machine learning algorithms to leverage known training sets of data to thereby predict filters that will be desired by a particular user during an online process 309.

That is, as shown, during the online process 309, a received user profile 310 may be provided to a user profile classification module 312, which also has access to the user classification model database 308. In other words, the user profile classification module 312 may be understood to represent an instance of the classifier 130, while the user classification model database 308 may be understood to represent an instance of the classification models 128 of FIG. 1.

Then, the user profile classification module 312 may be configured to execute a classification process in which the user profile 310 is used in conjunction with a received category (not specifically illustrated in FIG. 3, but represented by the category 108 of FIG. 1), to thereby utilize the user classification model database 308 to predict filters 314 to be displayed within a webpage 316.

Specifically, as shown, the predicted, customized filters 314 to be displayed within the webpage 316 may be included within a first portion 318 of the webpage 316. Specific examples of operations of the user profile classification module 312 are provided in more detail below, e.g., with respect to FIG. 5.

Meanwhile, in FIG. 3, historical search query 320 and merchandise metadata 322 may be utilized by a module 324 for generating training sets, in conjunction, in at least some implementations, with human input 326 from the human assistant. In this way, similarly to the offline process described above with respect to components 302-308 in the upper portion of FIG. 3, training sets 328 may be constructed.

Specifically, as shown, the training set 328 may include queries with attribute tags 330, which generally represent specific ones of the historical search query 320 that have been tagged with attributes corresponding directly to the merchandise metadata 322, as part of the training process associated with the generation of training sets referenced above.

In other words, as described in more detail below, with respect to FIG. 9, particular search terms included within the historical search query 320 may not correspond directly to a terminology, semantics, or syntax used within the merchandise metadata 322. For example, in the laptop computer example referenced above, the historical search query 320 may include various instances of words such as lightweight, light, or ultra-portable. Meanwhile, the merchandise metadata 322 may include actual weight of laptop computers, e.g., expressed in pounds. Thus, as part of the training process, each query may be tagged with attributes which relate the specific query term with corresponding attributes of the merchandise metadata 322.

In this way, even though the historical search query 320 may use different terminology than that of the merchandise metadata 322, individual query terms and phrases may be correlated with attribute tags that do correspond to the merchandise metadata 322. In this way, as described in detail below, e.g., with respect to FIG. 9, future queries may be classified as being associated with specific filters, e.g., of the filters 122 of FIG. 1. For example, historical search queries that include specific colors may be correlated with a color filter, while search queries with terms related to weight (e.g., lightweight, ultraportable, etc.) may be matched with a weight filter of the filters 122. In FIG. 3, this process is represented by a query classification training module 332, in which, as just referenced, tagged queries are correlated with corresponding filters, to thereby provide query/filter classification models 334.

In addition to enabling the prediction of desired filters based on currently-received queries, the training set 328 may include training sets 336 that enable prediction of actual values or value ranges to be assigned to the predicted filters. For example, in some cases, attributes used to tag queries in query terms may include subjective, non-comparable attributes, such as color. In these cases, it is not generally possible to differentiate the attributes in an objective manner.

On the other hand, other attributes may be objectively quantified with respect to available values or value ranges. For example, attributes such as weight, speed, or price represent objective, sortable attributes having potential values which may vary in extent within an overall continuum, spectrum, or range. In the example of FIG. 3, queries with polarity scores 336 thus represent or include polarity scores that are assigned to specific query terms and that quantify a direction or extent of these scored query terms with respect to corresponding, available value ranges.

For example, for the attribute of weight, terms such as lightweight, light, or ultra-portable may have low polarity scores, while query terms such as large or comfortable may have polarity scores at the other end of the available value range. Thus, additional query classification training 338 may be conducted to correlate the queries with polarity scores 336 with corresponding values or value ranges of corresponding filters. In this way, query/value classification models 340 may be constructed.

Thus, as with the components 302-308 in the upper part of the system 300 of FIG. 3, the various components 320-340 in the lower part of the system 300 of FIG. 3 represent an offline, design time process for constructing the classification models 334, 340. Then, during the online process 309, currently-received query words 342 may be provided to a query classification module 344, which utilizes the classification models 334, 340 to provide inferred filters and values 346. Additional detail regarding operations of the query classification module 344 are provided below, e.g., with respect to FIG. 5. However, in general, it may be appreciated from the above description of FIGS. 1 and 2 that the query classification module 344 predicts filters that would be desired by the user of the system 300, and then goes further to select specific values or value ranges to be assigned to the predicted filters.

Consequently, the predicted filters and values 346 may be applied, e.g., against the filters 122 and the product data 144 of FIG. 1, to thereby provide a list of specific products 348 within the webpage 316, corresponding to the value specific filtered products 114 of FIG. 1. Specific examples of operations of the query classification module 344 are provided below, e.g., with respect to FIG. 5.

Figure 4:
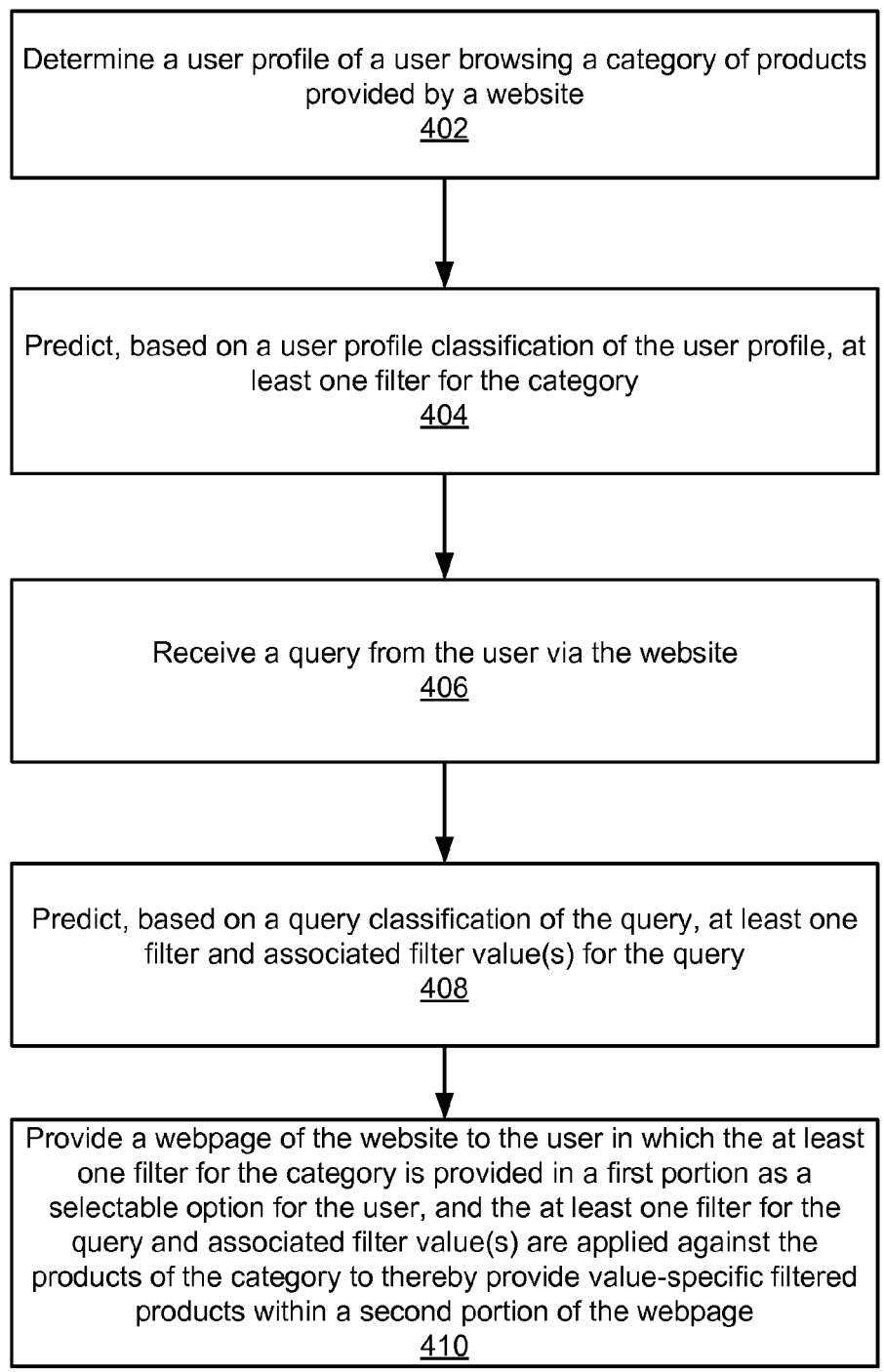
FIG. 4 is a flowchart illustrating example operations of the system of FIG. 3.

FIG. 4 is a flowchart 400 illustrating example operations of the system 300 of FIG. 3. As referenced above with respect to FIG. 2, sub-operations of the flowchart 400 are intended to be illustrative and non-limiting. Consequently, as described in detail with respect to FIG. 2, operations of the various implementations may be implemented in a parallel, nested, iterative, looped, or branched fashion, using any of operations 402-410 illustrated in FIG. 4, as well as any additional or alternative operations or sub-operations, as would be apparent.

In the example of FIG. 4, a user profile of a user, browser, category or product provided by a website may be determined (402). For example, as part of the online process 309, a category may be received from a user. In the example, the user may have previously logged in or otherwise authenticated to the website in question, thereby causing the website to retrieve the user's previously-stored user profile. In some cases, the category being browsed may be explicitly received from the user, while, in other implementations, the category may be inferred or derived from selections of the user.

Based on a user profile classification of the user profile, at least one filter for the category may be predicted (404). For example, as described, during an earlier offline process, user profile classification training 306 may be utilized to leverage basic user information 302 and order/browsing history 304 to construct the user classification model database 308. Then, the user profile classification 312 may utilize the user classification model database 308, the user profile 310, and the relevant category of products to predict the filters to display 314, for inclusion within the portion 318 of the webpage 316. As illustrated and described with respect to FIG. 3, the user profile classification 312 may be executed as part of the online process 309.

A query may be received from the user via the website (406). For example, the query words 342 may be received from the user, during a search by the user for a particular product or type of product.

Then, based on a query classification query for the query, at least one filter (and associated filter value(s)) may be predicted (408). For example, the query classification module 344 may utilize the previously-constructed classification models 334, 340 to predict the same or different filters as those predicted above as part of the operation 404, along with at least one associated filter value or value range.

Then, a webpage of the website may be provided to the user, in which the at least one filter for the category is provided in a first portion as a selectable option for the user, and the at least one filter for the query and associated filter value are applied against the products of the category to thereby provide values specific filter products within a second portion of the webpage (410). For example, as described with respect to FIG. 3, the customized filters 314 to display within the webpage 316 may be included within a portion 318, where the filters to display 314, as described, correspond to the user profile-specific filter for the selected category. As also shown in FIG. 3, the inferred filters and values 346 may be utilized to provide the value specific list of filtered products within the portion 308 of the webpage 316.

Figure 5:
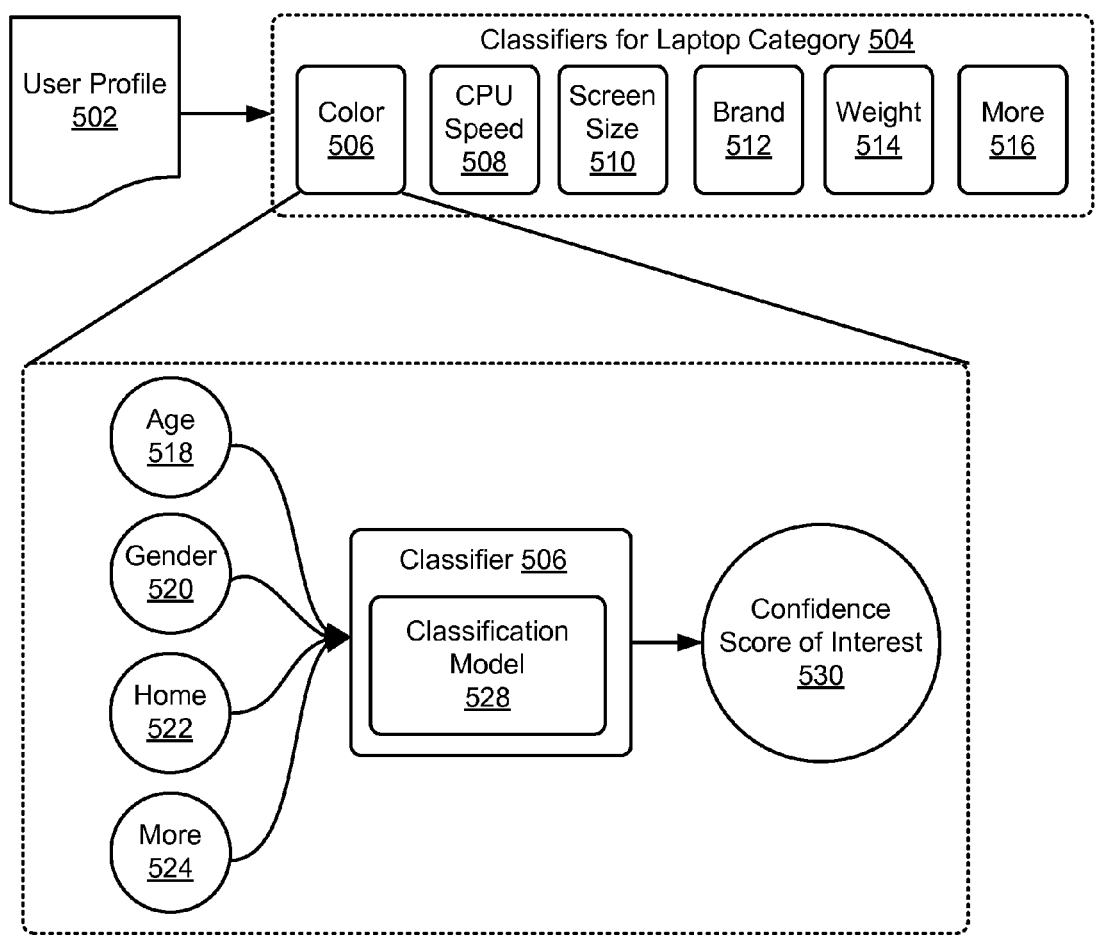
FIG. 5 is a block diagram of a system for filter selection based on a user profile, in accordance with the examples of FIGS. 1 and 3.

FIGS. 5-8 provide more detailed examples of the upper portion of FIG. 3, corresponding generally to operations 402, 404 of FIG. 4. Specifically, FIG. 5 is a block diagram illustrating operations of the user profile classification module 312 of FIG. 3.

As shown in FIG. 5, a user profile 502 is provided as input to a plurality of classifiers 504, which, in the example of FIG. 5, correspond to the category of laptop computers. Then, an output of each classifier 506-516 of the classifiers 504 is a confidence value representing an extent to which the user of the user profile 502 is likely to be interested in a specific, corresponding filter. Then, for a given category of products, the set 504 of classifiers provides an array of confidence values for all available, relevant filters.

In the specific example of FIG. 5, the classifiers 504 are illustrated as including a color classifier 506, a CPU speed classifier 508, a screen size classifier 510, a brand classifier 512, a weight classifier 514, and more classifiers 516 that may represent one or more additional laptop categories not specifically illustrated in the example of FIG. 5.

As shown, the color classifier 506 receives user profile input including age 518, gender 520, income 522, and more user profile characteristics 524. The classifier 506 includes a classification model 528, the construction and use of which is referenced above, and described in more detail below with respect to FIGS. 6 and 7.

As a result of operations of the color classifier 506, a confidence score 530 representing a possible interest of the user and a color filter is provided. Similar confidence scores for remaining classifiers 508-516 may similarly be provided, so that a subset of filters having the highest confidence scores may be selected.

FIG. 6 is a labeled training set example that may be used to construct the classification model 528 of FIG. 5, representing the user classification model database 308 of FIG. 3 and/or the classification models 128 of FIG. 1. With respect to FIG. 6, it is assumed that any applicable or appropriate supervised machine learning algorithm may be used to construct the classification model 528 for use by the classifier 506. In general, such supervised machine learning algorithms are designed to analyze a labeled training set, such as the label training set of FIG. 6, and to infer a classification function from the labeled training set. Then, the inferred classification function may be used to predict, in this case, customized filters that may be desired by the user of an associated user profile.

Examples of supervised machine learning algorithms that may be used include the naïve Bayesian, expectation-maximization algorithms, the support vector machine algorithm, or the artificial neural network algorithm. Of course, such examples are intended as illustrative, non-limiting examples, and other supervised learning algorithms may be used. Further, in other implementations, alternative artificial intelligence or machine learning techniques may be used, such as unsupervised machine learning algorithms, in which unlabeled data is used.

In the example of FIG. 6, the training set illustrated therein includes data 602 associated with a user profile data structure, including, for example, age, gender, location, income, browsing history, shopping history, search history, and various other user profile characteristics, not illustrated in the example of FIG. 6. The training data of FIG. 6 also includes a category 604, identified as the laptop category in the example of FIG. 6. The training data further includes a plurality of labels 606, in which various filters corresponding to the classifiers 508-516 are included, and a possible interest of an associated user in each filter/classifier is also included.

For the example of FIG. 6, there are many techniques that may be suitable for obtaining the labeled training set illustrated therein. For example, questionnaires may be provided to users, and answers from the users for the questionnaires may be utilized to construct training set of FIG. 6. Additionally, or alternatively, automatic methods may be used. For example, if the user previously set a particular filter to a certain value, then the user might be labeled as interested in that filter. Further, specific behaviors may be indicative of user interest, such as when a user searching for "white" indicates interest in color.

Figure 7:
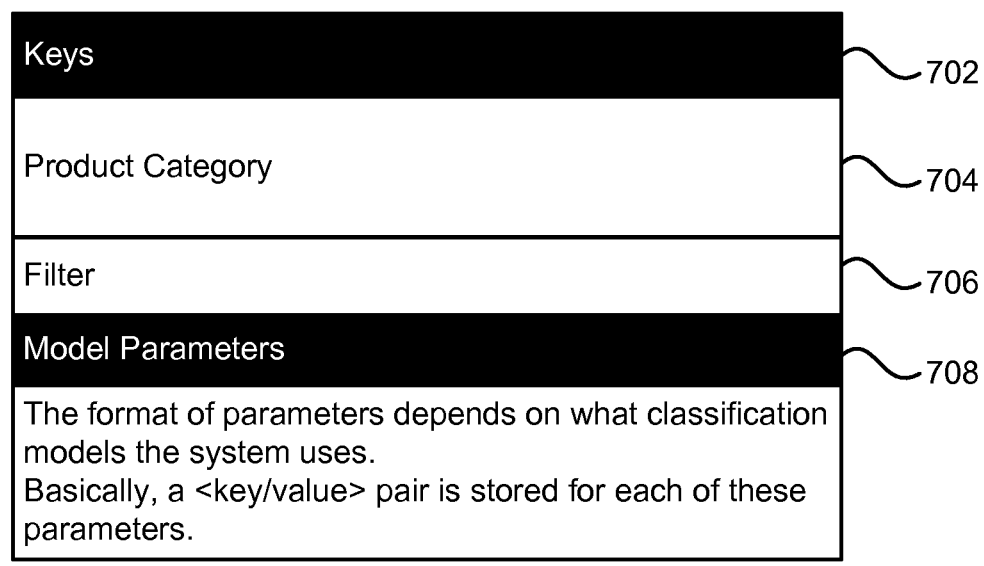
FIG. 7 is a table data structure of model parameters that may be used to store trained classification models in accordance with the examples of FIGS. 5 and 6.

FIG. 7 illustrates a database object structure of classification model parameters that may be determined from the training set of FIG. 6, using an appropriate supervised machine learning algorithm. As shown, the database object structure of FIG. 7 may include key 702, including a product category 704 and filter 706. Then, model parameters 708 may be represented as key-value pairs stored for corresponding parameters of classification models. For example, for the product category of laptop, and for the filter of price, a classification parameter of low income may be stored as the predictive of the user's interest in the price filter.

Figure 8:
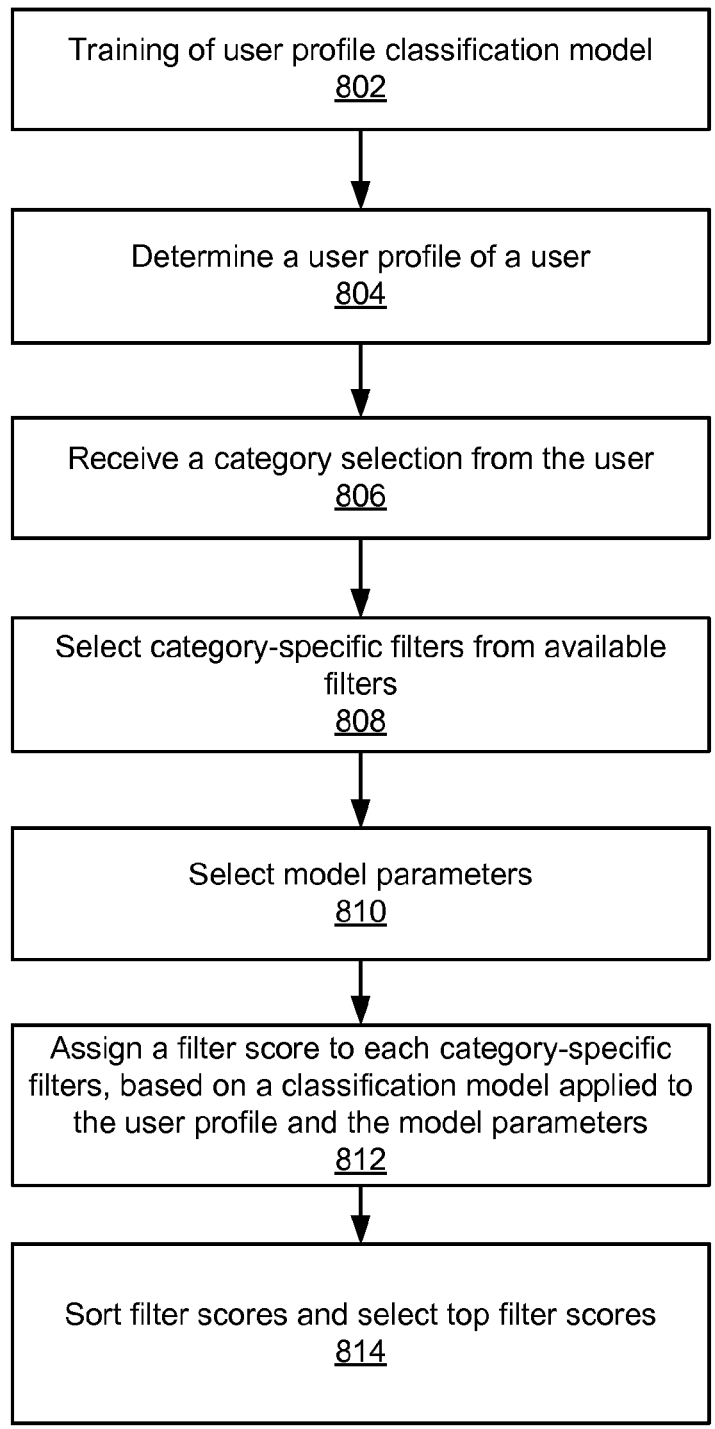
FIG. 8 is a flowchart illustrating example operations related to implementations in accordance with FIGS. 3-7.

FIG. 8 is a flowchart 800 illustrating detailed example operations of FIGS. 3-7. In the example of FIG. 8, an offline training of a user profile classification model may be executed (802), including utilizing the labeled training data of FIG. 6 to construct the user profile classification model of FIG. 7.

Once the offline training is completed, a current user profile of the user may be determined during an online process (804). For example, as described, a current user profile may be determined based on a current authenticated session of the user.

A category selection may be received from the user (806). For example, the user may select a category from a drop-down list of available categories of products.

Then, all category-specific filters included within available filters may be selected (808). For example, where the filters 122 may include a large plurality of filters, each associated with one or more categories, category-specific filters for the category of laptop computers may be selected as a subset thereof.

Appropriate model parameters may be selected (810). For example, classification model parameters for the selected category, and for each associated category-specific filter, may be determined. For example, as referenced above, for the category of laptop and the filter of price, a model parameter of user income may be selected. Then, a filter score may be assigned to each category-specific filter, based on a classification model applied to the user profile and the model parameters (812). For example, with respect to the example just given, a score for the price filter in the laptop category, based on the model parameter of income, and any other appropriate model parameters, may be assigned a value within a range of possible filter score values (e.g., a value within a filter score value of 1-100).

Thereafter, the resulting filter scores may be sorted, and the top filter scores may be selected (814). For example, as referenced above with respect to FIG. 1, the filter manager 132 may be configured to sort the category specific filters, based on the determined filter scores, and may select a number of top filter scores. For example, the number of top filter scores selected may be based on a current screen size of a device of the user, or on some other indicated user preference.

Pseudo Code 1 provides example pseudo code for an implementation of the flowchart 800 of FIG. 8:

---

Pseudo Code 1 Select filters for a user. Input: User profile P, current browsing category C, k is the number of filters needed

```
 1:  FUNCTION SelectFilters (P, C, k)
 2:  BEGIN
 3:     filter_list = select filters from all_filters where category = C
 4:     filter_scores = new dictionary( )
 5:     FOR filter IN filter_list
 6:        model_parameters = select parameters
                from models where category = C and filter = F
 7:        filter_scores[filter] = classify(P, model_parameters)
 8:     Sort filter_scores by values desc
 9:     RETURN top k filters from filter_scores
10:  END
```

Pseudo Code 1

Figure 9:
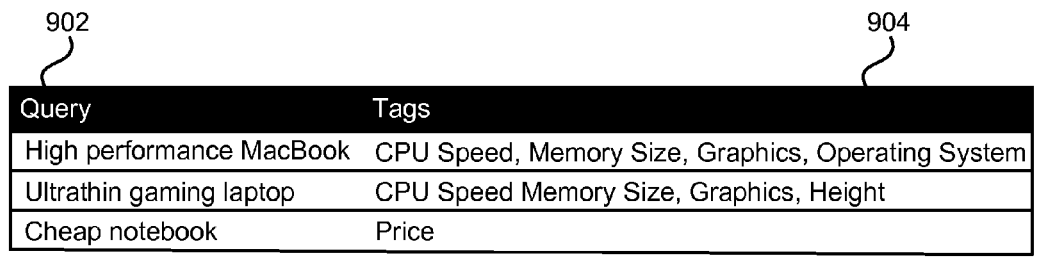
FIG. 9 is an example of training data for attribute identification for use in the systems of FIGS. 1 and 3.
Figure 10:
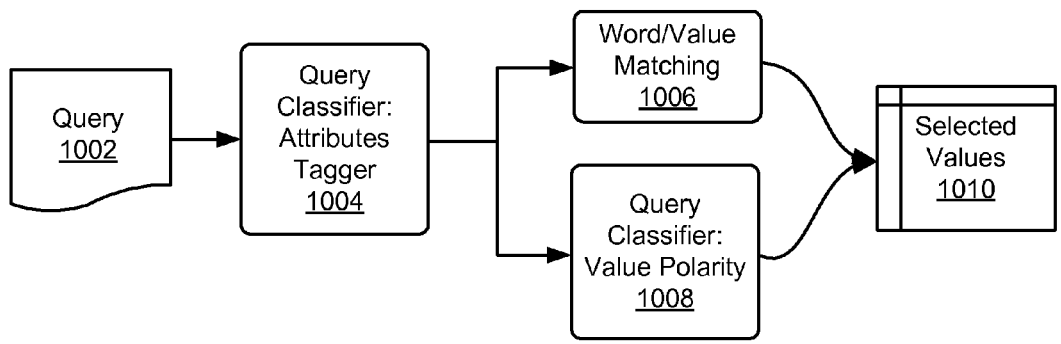
FIG. 10 is a block diagram of a system for query based filter value selection in accordance with the examples of FIGS. 1 and 3, and FIG. 9.
Figure 11:
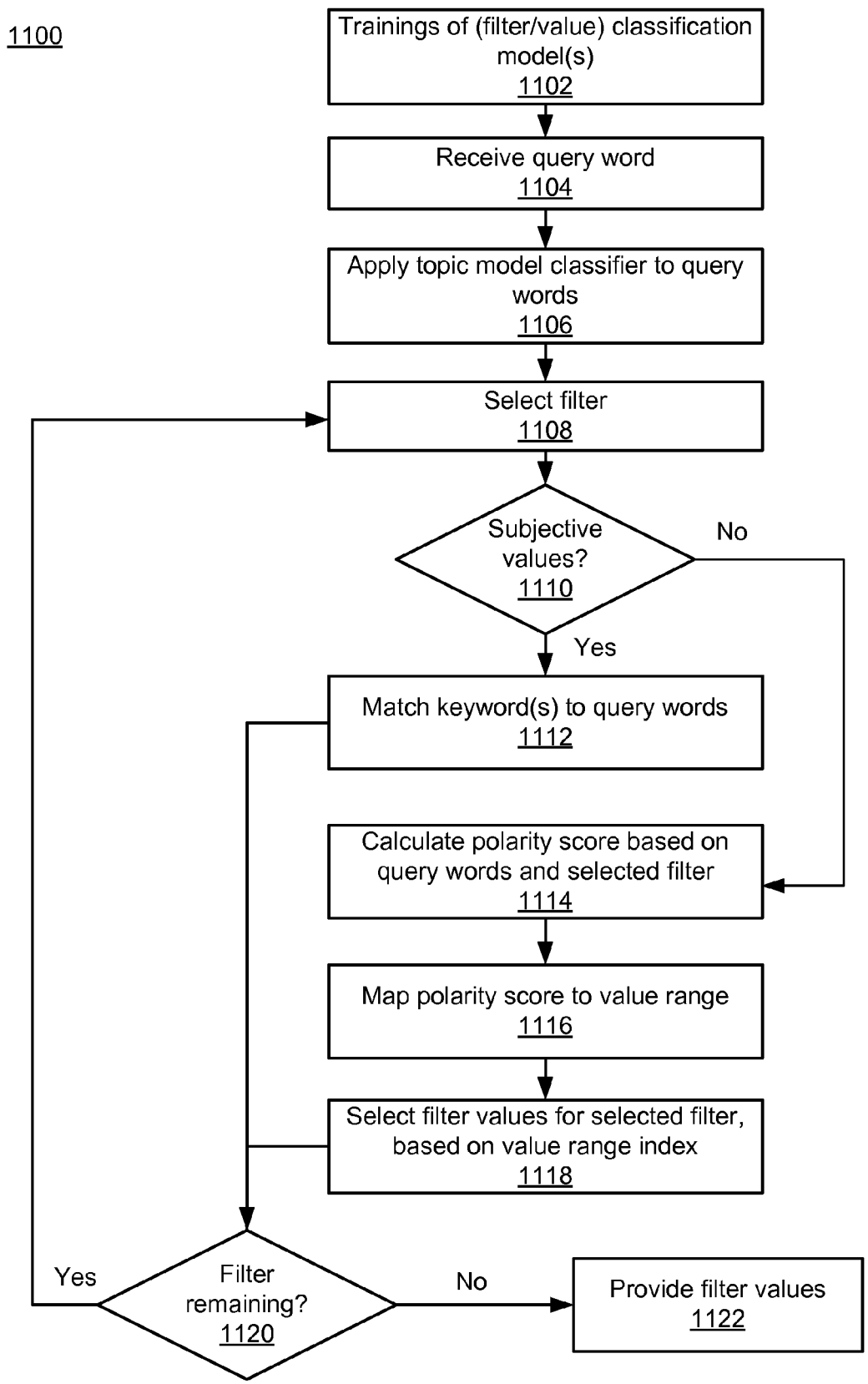
FIG. 11 is a flowchart illustrating detailed example operations for filter value selection, in accordance with FIGS. 9 and 10.

FIGS. 9-11 provide more detailed examples related to the lower portion of FIG. 3, including the providing of the inferred filters and value(s) 346 to generate the value-specific list of filtered products within the portion 348 of the webpage 316. As described with respect to FIG. 3, the system 300 is operable to not only reduce a number of filters provided to the user, but also to select associated options or values for selected filters. For example, if the query word(s) 342 of FIG. 3 include "white ultrathin laptop," then the portion 348 of the webpage 316 may include white laptops that are less than one inch thick. That is, the color filter may be automatically set to white, with no other color options being displayed, while a thickness filter may be set to "under one inch."

Initially, as described with respect to FIGS. 1 and 3, it is assumed that metadata 120 and 322 will be available for associated products/merchandise. As also referenced above, attributes included within product metadata for a particular category of products may initially be separated into attributes with objectively comparable numeric values (e.g., weight, size, memory size, or processor speed, in the example of laptop computers), and the second type of attributes which includes non-comparable categorical values (e.g., color, and other values that cannot objectively be compared to one another, as a matter of user preference).

As referenced above, a first stage of predicting filters based on a received query involve the use of associated classification models, and associated parameters, that are trained and stored within a database. As also referenced above, individual query words may need to be considered in the context of larger phrases of the query, or in the context of the query as a whole. Therefore, each query word many not be considered separately, but may be considered in the overall query context, including, potentially, the sequence of the query words within the query. Further, the query words will not necessarily align verbatim with the terminology, semantics, and syntax of the corresponding merchandise metadata. As a result, attributes of the merchandise metadata may effectively be considered to be hidden or implicit topics of received queries.

For example, the terms "processor" and "memory" may be considered to be related to the attribute of "performance" of a laptop computer, while width, height, depth, and weight all may be related to the attribute of "mobility." Thus, when a query includes the term "high performance" or "highly portable," the queries are not mentioning or including specific attributes, so that part of the classification process is to identify implicit query topics that correspond to specific attributes.

For example, topic model analysis techniques may be used, such as the labeled Latent Dirichlet Allocation (LDA) algorithm. In such examples, the labeled LDA algorithm will tag each query with relative product attributes. Then, similar to the training set of FIG. 6, for each product category, a labeled LDA model may be trained. The training sets for different queries may all be different.

FIG. 9 illustrates an example of tagged queries used as training data for attribute identification. In the example of FIG. 9, queries 902 are each tagged with associated attribute tags 904. Specifically, as shown, a query "high performance MacBook," may be tagged with attribute tags of: CPU, speed, memory size, graphics, and operating system. A query "ultrathin gaming laptop" may be tagged with attribute tags: CPU speed, memory size, graphics, and height. Finally in FIG. 9, the query "cheap notebook" may be tagged with the attribute tag of "price."

FIG. 10 is a block diagram illustrating example operations of the query classification module 344 of FIG. 3, using the training data for attribute identification of FIG. 9. In the example of FIG. 10, as shown, a query 1002 may be received by a query classifier 1004 configured to act as an attribute tagger for the query 1002. That is, the query classifier 1004 may be operable to associate relevant, appropriate attribute tags to each word or term of the query 1002.

As referenced above, some such attributes will have categorical, non-comparable, subjective values, such as color. In such cases, a simple mapping may be sufficient to match a given query word with a corresponding value, as shown by the word/value matching 1006 of FIG. 10.

For attributes having objective, comparable values, available value ranges for attributes and associated filters associated with words and terms of the query 1002 may be determined. For such attributes, it is possible to sort the attributes in a meaningful order. For example, as referenced above, a polarity of included query words may be determined, and a corresponding polarity direction of the available, relevant filter/attribute may be determined.

For example, it may occur that available laptop computers weigh between 1 pound and 6 pounds. However, the query 1002 is unlikely to include a desired weight in pounds. Instead, the query 1002 may include keywords such as lightweight, ultra-portable, or easy to carry. Such query terms may be determined to have the same polarity, because they all indicate a preference for relatively lower weight.

In example implementations, sentiment analysis used in natural language processing (NLP) techniques may be used. Specifically, such sentiment analysis techniques may be used to build a sentiment classifier for every attribute of every product category. Associated training classification techniques may be executed in accordance with the training classification techniques described above. In the example of FIG. 10, however, for a given query, the query classifier 1008 will provide a polarity score, and, based on that polarity score, a desire of the user with respect to the objective, comparable attribute may be determined.

Then, the determined polarity score may be mapped into a specific range of available values. For example, a continuous value range of a specific filter/attribute may be divided into several discrete areas. For example, such partitioning may be based on the available distribution of values in a particular circumstance. Then, a frequency of each value may be counted, and a histogram of value frequencies may be created. This histogram will generally have peaks and valleys of value frequencies, and such values may be used to define value areas, since such values may represent market relevant information (e.g., valleys may indicate values which are non-preferred by consumers).

Once several discrete areas of values are available, a matching process may be executed. In such matching processes, polarity values may be assigned within some predefined range, e.g., [0, 1]. Then, for example, in the "price" attribute of the laptop category, it may occur that the price value ranges from $300 to $3000. Then, for a given query, a polarity score of 0.7 may be determined, which may then be mapped to a mid-high price range within the available price range, e.g., between $800 and $1500. The utilized mapping function may be highly configurable, in order to ensure flexible implementations.

FIG. 11 is a flowchart 1100 illustrating example operations associated with the lower portion of FIG. 3, generally corresponding to operations 406, 408, and 410 of FIG. 4, and to FIGS. 9 and 10, as just described. In the example of FIG. 11, training of one or more classification models may be performed (1102). For example, training of the classification model 334, 340 may be conducted as described with respect to FIG. 3, in using the techniques described above with respect to FIG. 9.

Then, during an online process, query words may be received (1104), e.g., the query word 342 of FIG. 3. A topic model classifier, using an appropriately trained classification model, may be applied to the query words (1106). For example, a plurality of filters corresponding to attribute tagged to individual query words by action of the topic model classifier in using the appropriate classification model (e.g., the query/filter classification model 334).

The flowchart 1100 may continue with selection of a specific filter from the thus-obtained plurality of filters (1108). If the selected filter and associated attribute includes subjective, non-comparable, categorical values (1110), such as color, then corresponding keywords may be matched to the relevant query words (1112).

Otherwise, if objectively comparable values are included (1110), then a corresponding polarity score may be calculated, based on the query words and the selected filter (1114). Thereafter, the calculated polarity score may be mapped to a corresponding value range of the selected filter (1116). Consequently, filter values for the selected filter may be selected, based on a value range index (1118).

If any filters of the plurality of identified filters remains (1120), then a new filter may be selected (1108). Otherwise, the resulting filter values may be provided (1122). For example, the determined filter values may be applied against available product data 124, to thereby provide the value specific filtered products 114 of FIG. 1, or the value-specific list of filtered products within the portion 348 of the webpage 316.

Pseudo code 2 provides a pseudo code example for the online process for value setting just described with respect to FIG. 11:

| Pseudo Cod 2 Set filter values based on user inputted query words. Input: query words Q |
| --- |
| 1:    FUNCTION SelectFilters (Q) |
| 2:    BEGIN |
| 3:      filter_list = topic_model_classifier(Q) |
| 4:      filter_values = new dictionary( ) |
| 5:      FOR filter IN filter_list |
| 6:        IF filter has categorical values |
| 7:          filter_values[filter] = match_keyword_to_value(Q) |
| 8:        ELSE |
| 9:          polarity_score = calculate_polarity(Q, filter) |
| 10:         value_range_index = map_polarity_<br>            to_value_range(polarity_score) |
| 11:         filter_values[filter] = value_range_<br>            of_filter[filter][value_range_index] |
| 12:        END IF |
| 13:      END FOR |
| 14:      RETURN filter_values |
| 15:    END |

Pseudo Code 2

Thus, the techniques described herein provide customized filters for individual users, where the customized filters are based on user profiles of the users, and reflect preferences of the users. Moreover, techniques described herein provide for automatic setting of filter values for users, based on currently-received queries from the users. As described, available display area may be used in an efficient and effective manner to display the customized filter in products matching the selected filter values. As a result, as described herein, customers are provided with a convenient, efficient shopping experience, while providers may increase levels of profitability and customer satisfaction.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A system comprising:
   at least one processor; and
   instructions recorded on a non-transitory computer-readable medium, and executable by the at least one processor, the system including
      a classifier configured to cause the at least one processor to receive, via a website, user input associated with a product search of a user, the classifier being further configured to identify a plurality of filters associated with the product search and predict a user-specific filter subset, wherein the user input associated with the product search includes an identified category of products from among a plurality of categories, and wherein the plurality of filters includes category-specific filters with pre-designated search parameters corresponding to each category;
      a training manager configured to provide a plurality of user profile classification models based on a user profile of the user, wherein each of the plurality of user profile classification models corresponds to a category of the plurality of categories, and wherein the classifier predicts the user-specific filter subset based on at least one of the plurality of user profile classification models and on the user profile of the user; and
      a filter manager configured to cause the at least one processor to provide a filter portion of a webpage of the website to the user, the filter portion including the user-specific filter subset selected from the category-specific filters.

2. A computer-implemented method for executing instructions stored on a non-transitory computer readable storage medium, the method comprising:
   determining a user profile of a user browsing a category of products provided by a web site;
   predicting, based on a user profile classification of the user profile, at least one filter for the category, wherein the at least one filter is selected from a plurality of filters including category-specific filters with pre-designated search parameters corresponding to the category;
   receiving a query from the user via the website;
   predicting, based on a query classification of the query, at least one filter and associated filter value for the query; and
   providing a webpage of the website to the user in which the at least one filter for the category is provided in a first portion as a selectable option for the user, and the at least one filter for the query and at least one associated filter value are applied against the products of the category to thereby provide value-specific filtered products within a second portion of the webpage.

3. A computer program product, the computer program product being tangibly embodied on a non-transitory computer-readable storage medium and comprising instructions that, when executed, are configured to cause at least one processor to:

receive, via a web site, user input associated with a product search of a user, the user input including a category of products and a query;

predict a first filter associated with the category, based on a user profile of the user and on a user profile classification model, wherein the first filter is selected from a plurality of filters including category-specific filters with pre-designated search parameters corresponding to the category;

predict a second filter associated with the query and the category, based on the query and on a filter classification model;

predict at least one value for the second filter; and provide a webpage of the website to the user, the webpage including the first filter associated with the category as a user-selectable option for filtering products displayed on the webpage, and including value-specific filtered products obtained by applying the second filter associated with the query against available products, using the at least one value.

4. The system of claim 1, wherein the filter manager is configured to rank included filters of the user-specific filter subset based on the user profile, and provide a determined number of the highest-ranked filters thereof within the filter portion of the webpage.

5. The system of claim 1 wherein each of the plurality of user profile classification models is determined from labeled training data.

6. The system of claim 1, wherein the classifier is configured to predict the user-specific filter subset during an online process in response to a receipt of the identified category, and the filter manager is configured to provide the filter portion of the webpage as part of the online process.

7. The system of claim 1, wherein the product search includes receipt of a query, and wherein the classifier is configured to predict the user-specific filter subset based on the query, and the filter manager is configured to provide the filter portion of the webpage including applying the predicted user-specific filter subset against available products, using predicted filter values, to obtain value-specific filtered products for inclusion within the webpage.

8. The system of claim 1, wherein the product search includes receipt of a query, and wherein the training manager is configured to provide at least one filter classification model, the filter classification model being determined from labeled training data in which previously-received queries are labeled with related product attributes, and wherein the classifier is configured to predict the user-specific filter subset based on the at least one filter classification model and on the received query.

9. The method of claim 2, wherein the predicting, based on the user profile classification of the user profile, at least one filter for the category, comprises:

providing a plurality of user profile classification models based on the user profile of the user, wherein each of the plurality of user profile classification models is determined from labeled training data and corresponds to the category of products; and predicting the at least one filter for the category based on the plurality of user profile classification models and on the user profile of the user.

10. The method of claim 2, wherein the predicting, based on the query classification of the query, at least one filter and associated filter value for the query, comprises:

providing at least one filter classification model, the filter classification model being determined from labeled training data in which previously-received queries are labeled with related product attributes; and predicting the at least one filter based on the at least one filter classification model and on the received query.

11. The computer program product of claim 3, wherein the user profile classification model is determined from labeled training data and corresponds to the category of products.

12. The computer program product of claim 3, wherein the first filter associated with the category and the second filter associated with the query are provided during an online process in response to the receipt of the category and the query, and the webpage is provided as part of the online process.

13. The computer program product of claim 3, wherein the filter classification model is determined from labeled training data in which previously-received queries are labeled with related product attributes.

14. The computer program product of claim 3, wherein the instructions, when executed, are further configured to cause the at least one processor to:

provide at least one value classification model; and select the at least one value for the second filter, based on the at least one value classification model, wherein a product attribute associated with the query using the filter classification model is an objective attribute associated with a sortable continuum of values, and a polarity of a query term within the query relative to the sortable continuum of values is used to determine the at least one value.

15. The system of claim 8, wherein:

the training manager is configured to provide at least one value classification model, the classifier is configured to select at least one corresponding value for each product attribute determined to be associated with the query by the filter classification model, based on the at least one value classification model; and the filter manager is configured to apply the user-specific filter subset against product data, using the at least one corresponding value for each filter therein, to obtain value-specific filtered products for inclusion within the webpage.

16. The method of claim 10, wherein the predicting, based on the query classification of the query, at least one filter and associated filter value for the query, comprises:

providing at least one value classification model; and selecting the at least one filter value for each product attribute determined to be associated with the query by the filter classification model, based on the at least one value classification model.

17. The system of claim 15, wherein a product attribute associated with the query is a subjective attribute, and the filter manager is configured to match a query term within the query with the subjective attribute to determine the at least one corresponding value.

18. The system of claim 15, wherein the product attribute associated with the query is an objective attribute associated with a sortable continuum of values, and the filter manager is configured to determine a polarity of a query term within the query relative to the sortable continuum of values to determine the at least one corresponding value.

* * * * *